(12) United States Patent
Hu et al.

(10) Patent No.: US 11,348,501 B2
(45) Date of Patent: May 31, 2022

(54) SHIFT REGISTER AND DRIVING METHOD THEREOF, GATE DRIVING CIRCUIT AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Qi Hu, Beijing (CN); Hui Jing, Beijing (CN); Danhong Zhao, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 336 days.

(21) Appl. No.: 16/488,737

(22) PCT Filed: Nov. 30, 2018

(86) PCT No.: PCT/CN2018/118637
§ 371 (c)(1),
(2) Date: Aug. 26, 2019

(87) PCT Pub. No.: WO2019/174309
PCT Pub. Date: Sep. 19, 2019

(65) Prior Publication Data
US 2021/0335178 A1    Oct. 28, 2021

(30) Foreign Application Priority Data

Mar. 15, 2018  (CN) .......................... 201810214570.9

(51) Int. Cl.
*G09G 3/20*   (2006.01)
*G11C 19/28*  (2006.01)

(52) U.S. Cl.
CPC ............... *G09G 3/20* (2013.01); *G11C 19/28* (2013.01); *G09G 2300/0426* (2013.01);
(Continued)

(58) Field of Classification Search
CPC ............. G09G 3/20; G09G 2310/0251; G09G 2300/0426; G09G 2310/0267; G09G 2310/08; G09G 2310/0286; G11C 19/28
See application file for complete search history.

(56) References Cited

U.S. PATENT DOCUMENTS 9,734,918 B2   8/2017  Xiaoging et al.
9,984,642 B2   5/2018  Lv et al.
(Continued)

FOREIGN PATENT DOCUMENTS

CN   102708778 A   10/2012
CN   102800289 A   11/2012
(Continued)

OTHER PUBLICATIONS

1st office action dated Mar. 5, 2020 in counterpart CN201810214570.9 with English Translation.

*Primary Examiner* — Grant Sitta
(74) *Attorney, Agent, or Firm* — Nath, Goldberg & Meyer; Joshua B. Goldberg

(57) ABSTRACT

The present disclosure provides a shift register and a driving method thereof, a gate driving circuit and a display device. The shift register includes: a pre-charging circuit coupled to a pre-charging signal input terminal and a pull-up node to pre-charge a potential of the pull-up node; a pull-down control circuit coupled to the pull-up node, a pull-down node and a reset signal input terminal to pull down a potential of the pull-down node or pull up the potential of the pull-down node; a pull-up circuit coupled to the pull-up node and a signal output terminal to pull up a potential of the signal (Continued)

output terminal; a pull-down circuit coupled to the pull-down node and the signal output terminal to pull down the potential of the signal output terminal; reset circuit coupled to the pull-up node and the pull-down node reset the potential of the pull-up node.

15 Claims, 5 Drawing Sheets

(52) U.S. Cl.
CPC ............... *G09G 2310/0251* (2013.01); *G09G 2310/0267* (2013.01); *G09G 2310/0286* (2013.01); *G09G 2310/08* (2013.01)

(56) References Cited

U.S. PATENT DOCUMENTS

| | | | |
|---|---|---|---|
| 2012/0105397 A1* | 5/2012 | Tan | G09G 3/3677 345/205 |
| 2017/0032750 A1* | 2/2017 | Shao | G11C 19/28 |
| 2017/0323609 A1* | 11/2017 | Zhao | H03K 17/6871 |
| 2017/0372654 A1 | 12/2017 | So et al. | |
| 2018/0053471 A1 | 2/2018 | Lin et al. | |

FOREIGN PATENT DOCUMENTS

| | | |
|---|---|---|
| CN | 105529009 A | 4/2016 |
| CN | 108428468 A | 8/2018 |

* cited by examiner

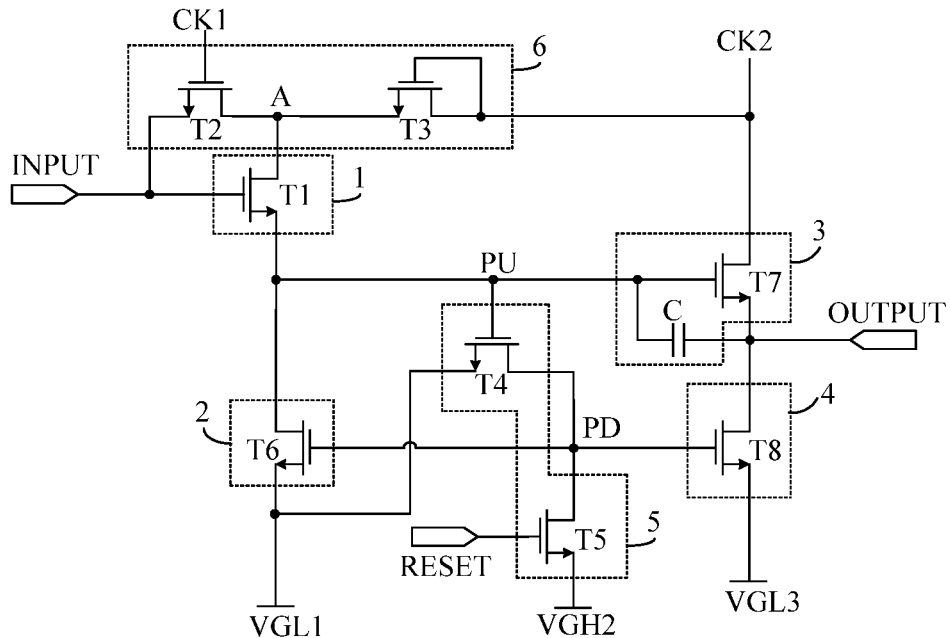

FIG. 5 during a pre-charging phase, the pre-charging circuit pre-charges the potential of the pull-up node in response to the pre-charging signal supplied from the pre-charging signal input terminal, and the pull-down control circuit pulls down the potential of the pull-down node to the second potential in response to the potential of the pull-up node — S101 during an output stage, the pull-up circuit pulls up the potential of the signal output terminal in response to the potential of the pull-up node — S102 during a reset phase, the pull-down control circuit pulls up the potential of the pull-down node to the first potential in response to the reset signal supplied from the reset signal input terminal, the reset circuit reset the potential of the pull-up node in response to the first potential of the pull-down node, and the pull-down circuit pulls down the potential of the signal output terminal in response to the first potential of the pull-down node — S103

FIG. 6

SHIFT REGISTER AND DRIVING METHOD THEREOF, GATE DRIVING CIRCUIT AND DISPLAY DEVICE

CROSS-REFERENCE TO RELATED APPLICATION

This is a National Phase Application filed under 35 U.S.C. 371 as a national stage of PCT/CN2018/118637, filed Nov. 30, 2018, an application claiming the benefit of Chinese Patent Application No. 201810214570.9, filed on Mar. 15, 2018, the content of each of which is hereby incorporated by reference in its entirety.

TECHNICAL FIELD

The present disclosure relates to a shift register and a driving method thereof, a gate driving circuit and a display device.

BACKGROUND

The shift register in the related art generally includes a reset circuit for resetting a potential of a pull-up node in the shift register during a reset phase. The reset circuit includes a transistor whose gate is coupled to a reset signal input terminal.

SUMMARY

An embodiment of the present disclosure provides a shift register, which includes: a pre-charging circuit respectively coupled to a pre-charging signal input terminal and a pull-up node, and configured to pre-charge a potential of the pull-up node in response to a pre-charging signal supplied from the pre-charging signal input terminal; a pull-down control circuit respectively coupled to the pull-up node, a pull-down node and a reset signal input terminal, and configured to pull down a potential of the pull-down node to a second potential in response to the potential of the pull-up node, and pull up the potential of the pull-down node to a first potential in response to a reset signal supplied from the reset signal input terminal; a pull-up circuit respectively coupled to the pull-up node and a signal output terminal, and configured to pull up a potential of the signal output terminal in response to the potential of the pull-up node for outputting; a pull-down circuit respectively coupled to the pull-down node and the signal output terminal, and configured to pull down the potential of the signal output terminal in response to the first potential of the pull-down node; and a reset circuit respectively coupled to the pull-up node and the pull-down node, and configured to be turned off in response to the second potential of the pull-down node, and reset the potential of the pull-up node in response to the first potential of the pull-down node.

In some implementations, the pre-charging circuit includes a first transistor, a control electrode of the first transistor is coupled to the pre-charging signal input terminal, a first electrode of the first transistor is coupled to the pre-charging signal input terminal, and a second electrode of the first transistor is coupled to the pull-up node.

In some implementations, the shift register further includes a voltage stabilizing circuit coupled to the first electrode of the first transistor and a second clock signal input terminal, and configured to supply a high-level potential to the first electrode of the first transistor in response to a second clock signal at a high-level potential supplied from the second clock signal input terminal.

In some implementations, the voltage stabilizing circuit includes a second transistor and a third transistor, the first electrode of the first transistor is coupled to the pre-charging signal input terminal through the second transistor; a control electrode of the second transistor is coupled to a first clock signal input terminal, a first electrode of the second transistor is coupled to the pre-charging signal input terminal, and a second electrode of the second transistor is coupled to the first electrode of the first transistor; a control electrode of the third transistor is coupled to the second clock signal input terminal, a first electrode of the third transistor is coupled to the first electrode of the first transistor, and a second electrode of the third transistor is coupled to the second clock signal input terminal; the second clock signal supplied from the second clock signal input terminal has a phase opposite to a phase of the first clock signal supplied from the first clock signal input terminal.

In some implementations, the pull-down control circuit includes a fourth transistor and a fifth transistor, a control electrode of the fourth transistor is coupled to the pull-up node, a first electrode of the fourth transistor is coupled to a first power terminal, and a second electrode of the fourth transistor is coupled to the pull-down node; a control electrode of the fifth transistor is coupled to the reset signal input terminal, a first electrode of the fifth transistor is coupled to the pull-down node, and a second electrode of the fifth transistor is coupled to a second power terminal.

In some implementations, the reset circuit includes a sixth transistor, a control electrode of the sixth transistor is coupled to the pull-down node, a first electrode of the sixth transistor is coupled to the pull-up node, and a second electrode of the sixth transistor is coupled to the first power terminal.

In some implementations, the pull-up circuit includes a seventh transistor and a capacitor, a control electrode of the seventh transistor is coupled to the pull-up node, a first electrode of the seventh transistor is coupled to the second clock signal input terminal, and a second electrode of the seventh transistor is coupled to the signal output terminal, and a first end of the capacitor is coupled to the pull-up node, and a second end of the capacitor is coupled to the signal output terminal.

In some implementations, the pull-down circuit includes an eighth transistor, a control electrode of the eighth transistor is coupled to the pull-down node, a first electrode of the eighth transistor is coupled to the signal output terminal, and a second electrode of the eighth transistor is coupled to a third power terminal.

In some implementations, the reset circuit is coupled to the first power terminal, and configured to supply, in response to the first potential of the pull-down node, a first power voltage supplied from the first power terminal to the pull-up node to reset the pull-up node; the pull-down control circuit is coupled to the second power terminal and configured to supply, in response to the reset signal, a second power voltage supplied from the second power terminal to the pull-down node to pull up the potential of the pull-down node to the first potential; the pull-down circuit is coupled to the third power terminal and configured to supply, in response to the potential of the pull-down node, a third power voltage supplied from the third power terminal to the signal output terminal to pull down the potential of the signal output terminal; and the pull-up circuit is coupled to the second clock signal input terminal and configured to pull up, in response to the potential of the pull-up node, the potential of the signal output terminal by using the second clock signal input from the second clock signal input terminal for outputting.

In some implementations, both the first power voltage and the third power voltage are voltages at a low-level, and the second power voltage is a voltage at a high-level.

An embodiment of the present disclosure provides a gate driving circuit, which includes a plurality of shift registers cascaded, each of the shift registers is the above shift register; except the shift register of the first stage, the pre-charging signal input terminal of the shift register of each stage is coupled to the signal output terminal of the shift register of a previous stage; except the shift register of the last stage, the reset signal input terminal of the shift register of each stage is coupled to the signal output terminal of the shift register of a next stage.

An embodiment of the present disclosure provides a display device including the above gate driving circuit.

An embodiment of the present disclosure provides a driving method of the above shift register, the driving method includes the following steps: during a pre-charging phase, the pre-charging circuit pre-charges the potential of the pull-up node in response to the pre-charging signal supplied from the pre-charging signal input terminal, and the pull-down control circuit pulls down the potential of the pull-down node to the second potential in response to the potential of the pull-up node; during an output phase, the pull-up circuit pulls up the potential of the signal output terminal in response to the potential of the pull-up node; during a reset phase, the pull-down control circuit pulls up the potential of the pull-down node to the first potential in response to the reset signal supplied from the reset signal input terminal, the reset circuit resets the potential of the pull-up node in response to the first potential of the pull-down node, and the pull-down circuit pulls down the potential of the signal output terminal in response to the first potential of the pull-down node.

In some implementations, the driving method further includes a step: a voltage stabilizing circuit supplies a potential at a high-level to the first electrode of the first transistor.

In some implementations, the driving method further includes steps: during the pre-charging phase, the pull-down control circuit supplies a voltage at a low-level to the pull-down node in response to the potential of the pull-up node to pull down the potential of the pull-down node to the second potential; during the reset phase, the pull-down control circuit supplies a voltage at a high-level to the pull-down node in response to the reset signal to pull up the potential of the pull-down node to the first potential, and the reset circuit supplies a voltage at a low-level to the pull-up node to reset the pull-up node in response to the first potential of the pull-down node, and the pull-down circuit supplies, in response to the first potential of the pull-down node, a voltage at a low-level to the signal output terminal to pull down the potential of the signal output terminal.

BRIEF DESCRIPTION OF THE DRAWINGS

FIG. 5 is a schematic diagram of a circuit structure of a shift register according to an embodiment of the present disclosure;

FIG. 6 is a flowchart of a driving method of a shift register according to an embodiment of the present disclosure;

DETAILED DESCRIPTION

In order to enable those skilled in the art to better understand the technical solutions of the present disclosure, a shift register, a driving method thereof, a gate driving circuit and a display device provided by the present disclosure are described in detail below with reference to the accompanying drawings. Each of transistors in the present disclosure may be a thin film transistor or a field effect transistor or any other switching device having the same characteristics. A transistor typically includes three electrodes: a gate, a source and a drain. The source and drain of the transistor are structurally symmetrical, and are interchangeable as desired. In the present disclosure, a control electrode refers to the gate of the transistor, one of a first electrode and a second electrode is the source, and the other of the first electrode and the second electrode is the drain.

In addition, according to the characteristics of transistors, the transistors can be classified into N-type transistors and P-type transistors. In a case where the transistor is an N-type transistor, an on-voltage of the transistor is a high-level voltage, an off-voltage of the transistor is a low-level voltage. In a case where the transistor is a P-type transistor, an on-voltage of the transistor is a low-level voltage, and an off-voltage of the transistor is a high-level voltage. In the embodiments of the present disclosure, an example in which each of the transistors is an N-type transistor will be exemplified.

In practical applications, it is found that in a case where the shift register operates in a pre-charging phase, the gate of the transistor in the reset circuit is in a floating state.

Since transistors used in the manufacturing process of a display panel in the related art generally are oxide thin film transistors (TFTs), each of the oxide TFTs usually is a depleted transistor, and when the gate of the transistor is in a floating state, the oxide TFT is prone to be turned on, and thus outputting a leakage current. That is, the transistor in the reset circuit may be turned on during the pre-charging phase, and external noise signal is easy to be written thereinto, i.e., the reset circuit outputs a leakage current, thereby affecting the pre-charging process of a potential of a pull-up node, and thus affecting outputting of a signal output terminal of the shift register.

Figure 1:
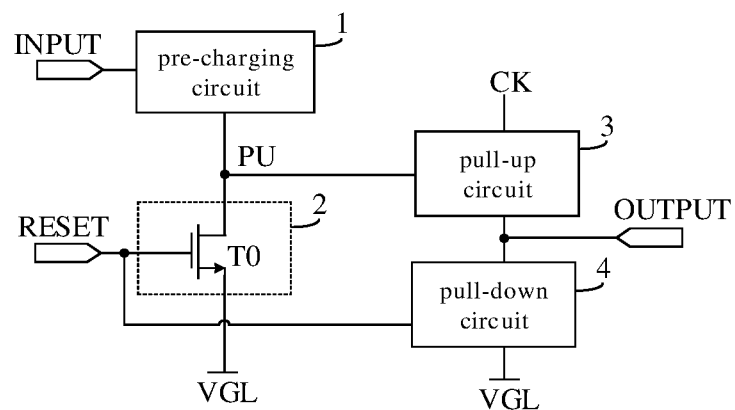
FIG. 1 is a schematic diagram showing a circuit structure of a shift register in the related art.

FIG. 1 is a schematic diagram of a circuit structure of a shift register in the related art. As shown in FIG. 1, the shift register includes: a pre-charging circuit 1, a reset circuit 2, a pull-up circuit 3, and a pull-down circuit 4. The pre-charging circuit 1, the reset circuit 2 and the pull-up circuit 3 are all coupled to a pull-up node PU. The reset circuit 2 in the related art includes: a transistor T0, a gate of which is coupled to a reset signal input terminal RESET. During the pre-charging phase, the pre-charging circuit 1 pre-charges the potential of the pull-up node PU under the control of a pre-charging signal supplied from the pre-charging signal input terminal INPUT. At the same time, the gate of the transistor T0 is in a floating state, thus the transistor T0 is prone to be turned on and outputs a leakage current, thereby affecting the pre-charging process.

Therefore, how to avoid the influence of the reset circuit outputting the leakage current during the pre-charging phase on the pre-charging process is a technical problem to be solved urgently by those skilled in the art.

In order to solve the problem that the reset circuit outputs the leakage current in the pre-charging phase and thus affecting the pre-charging process, embodiments of the present disclosure provide a shift register, a driving method thereof, a gate driving circuit and a display device.

Figure 2:
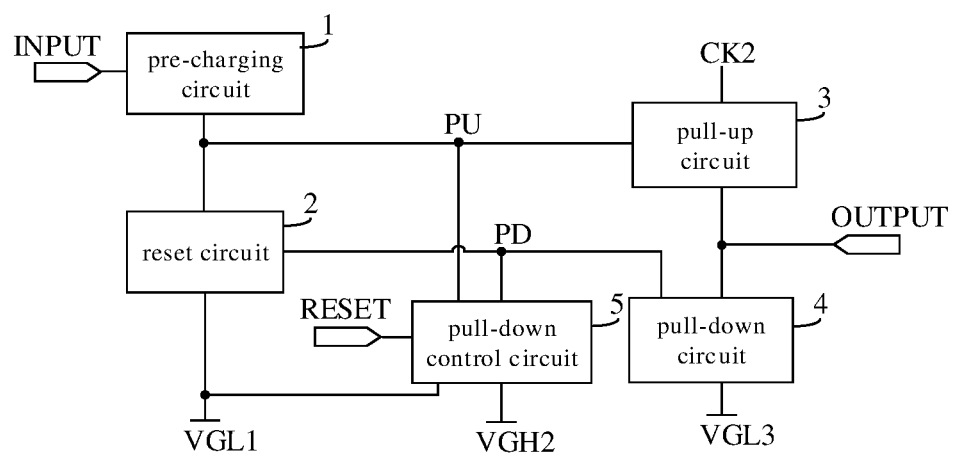
FIG. 2 is a schematic diagram of a circuit structure of a shift register according to an embodiment of the present disclosure.

FIG. 2 is a schematic diagram of a circuit structure of a shift register according to an embodiment of the present disclosure. As shown in FIG. 2, the shift register may include a pre-charging circuit 1, a reset circuit 2, a pull-up circuit 3, a pull-down circuit 4 and a pull-down control circuit 5.

The pre-charging circuit 1 is coupled to the pre-charging signal input terminal INPUT and the pull-up node PU, respectively, and configured for pre-charging the potential of the pull-up node PU in response to the pre-charging signal supplied from the pre-charging signal input terminal INPUT.

The pull-down control circuit 5 is coupled to the pull-up node PU, the pull-down node PD and the reset signal terminal RESET, respectively, and configured for pulling down a potential of the pull-down node PD to a second potential in response to the potential of the pull-up node PU, and pulling up the potential of the pull-down node PD to a first potential in response to the reset signal supplied from the reset signal input terminal RESET.

The pull-up circuit 3 is coupled to the pull-up node PU and the signal output terminal OUTPUT, respectively, and configured for pulling up a potential of the signal output terminal OUTPUT in response to the potential of the pull-up node PU for outputting.

The pull-down circuit 4 is coupled to the pull-down node PD and the signal output terminal OUTPUT, respectively, and configured for pulling down the potential of the signal output terminal OUTPUT in response to the first potential of the pull-down node PD.

The reset circuit 2 is coupled to the pull-up node PU and the pull-down node PD, respectively, and configured for being turned off in response to the second potential of the pull-down node PD, and resetting the pull-up node PU in response to the first potential of the pull-down node PD.

An operation process of the shift register provided by embodiments of the present disclosure may include three phases: a pre-charging phase, an output phase and a reset phase. The following description will be made with reference to the circuit structure of the shift register shown in FIG. 2, and the shift register in this embodiment is further configured as follows: for example, the reset circuit 2 is coupled to a first power terminal VGL1 and configured for supplying, in response to the first potential of the pull-up node PD, a first power voltage supplied from the first power terminal to the pull-up node PU to reset the pull-up node PU; the pull-down control circuit 5 is coupled to a second power terminal VGH2 and configured for supplying, in response to the reset signal, a second power voltage supplied from the power supply terminal to the pull-down node PD to pull up the potential of the pull-down node PD to the first potential; the pull-down circuit 4 is coupled to a third power terminal VGL3 and configured for supplying, in response to the potential of the pull-down node PD, a third power voltage supplied from the third power terminal to the signal output terminal OUTPUT to pull down the potential of the signal output terminal OUTPUT; the pull-up circuit is coupled to a second clock signal input terminal CK2 and configured for pulling up, in response to the first potential of the pull-up node PU, the potential of the signal output terminal OUTPUT for outputting.

In the pre-charging phase, the pre-charging circuit 1 pre-charges the potential of the pull-up node PU in response to the pre-charging signal supplied from the pre-charging signal input terminal INPUT. For example, the pre-charging circuit 1 pre-charges the pull-up node PU to a high-level potential in response to the pre-charging signal.

At the same time, the pull-down control circuit 5 pulls down the potential of the pull-down node PD to the second potential in response to the potential of the pull-up node PU. For example, the second potential is a low-level potential. The pull-down control circuit 5 is coupled to a first power terminal that supplies a first power voltage VGL1 being at a low-level, and the pull-down control circuit 5 writes, in response to the high-level potential of the pull-up node PU, the first power voltage VGL1 at the low-level to the pull-down node PD to pull down the potential of the pull-down node PD to a low-level potential.

During the pre-charging phase, since the potential of the pull-down node PD is pulled down to a low-level potential, the potential of the pull-down node PD is always at a low-level. Since the reset circuit 2 is controlled by the potential of the pull-down node PD, in a case where the potential of the pull-down node PD is at the low-level, the reset circuit 2 does not operate and does not output a leakage current, and thus does not affect the pre-charging of the pull-up node PU, ensuring a pre-charging effect.

During the output phase, the pull-up circuit 3 pulls up the potential of the signal output terminal OUTPUT in response to the potential of the pull-up node PU. For example, the pull-up circuit 3 is coupled to a clock signal input terminal CK2 that supplies a second clock signal, and the clock signal supplied from the clock signal input terminal CK2 is at a high-level during the output phase, and the pull-up circuit 3 writes, in response to the high-level potential of the pull-up node PU, the clock signal at a high-level to the signal output terminal to pull up the potential of the signal output terminal, for example, to a high-level potential.

During the reset phase, the pull-down control circuit 5 pulls up the potential of the pull-down node PD to the first potential in response to the reset signal supplied from the reset signal input terminal RESET. For example, the first potential may be a high-level potential. The pull-down control circuit 5 is coupled to a second power terminal that supplies a second power voltage VGH2 being at a high-level, and the pull-down control circuit 5 writes, in response to the reset signal being a high-level potential, the second power voltage VGH2 at the high-level to the pull-down node PD to pull up the potential of the pull-down node PD, for example, to a high-level potential.

Further, the reset circuit 2 resets the pull-up node PU in response to the first potential of the pull-down node PD. For example, the first potential is a high-level potential. The reset circuit 2 is coupled to a first power terminal that supplies a first power voltage VGL1 being at a low-level, and the reset circuit 2 writes, in response to the high-level potential of the pull-down node PD, the first power voltage VGL1 at the low-level to the pull-up node PU to pull down the potential of the pull-up node PU, for example, to a low-level potential, thereby achieving reset.

At the same time, the pull-down circuit 4 pulls down the potential of the signal output terminal in response to the first potential of the pull-down node PD. The pull-down circuit 4 is coupled to a third power terminal that supplies a third power voltage VGL3 being at a low-level, and the pull-down circuit 4 writes, in response to the high-level potential of the pull-down node PD, the third power voltage VGL3 at the low-level to the signal output terminal OUTPUT to pull down the potential of the signal output terminal OUTPUT to a low-level potential. It should be noted that the first power terminal may be the same as the third power terminal.

In the technical solutions of embodiments of the present disclosure, the pull-down control circuit is provided and the reset circuit is controlled by using the pull-down node. During the pre-charging phase, the pull-down control circuit pulls down the potential of the pull-down node so that the pull-down node is at a low-level, thus the reset circuit does not operate, and does not output a leakage current, thereby avoiding the reset circuit affecting the pre-charging process of the pull-up node.

Figure 3:
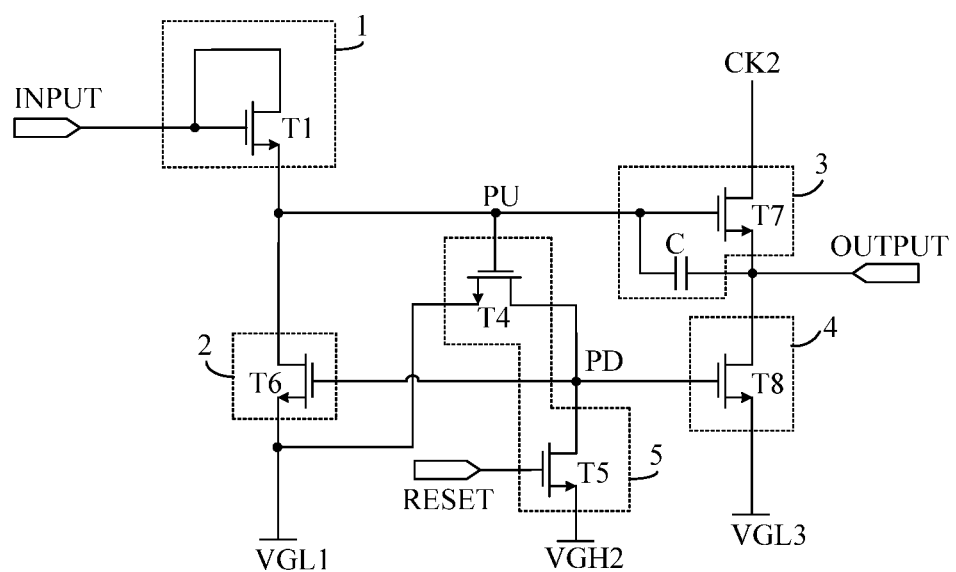
FIG. 3 is a schematic diagram of a circuit structure of a shift register according to an embodiment of the present disclosure.

FIG. 3 is a schematic diagram of a circuit structure of a shift register according to an embodiment of the present disclosure. As shown in FIG. 3, the shift register is a specific embodiment based on the shift register shown in FIG. 2. The pre-charging circuit 1 may include a first transistor T1, a control electrode of the first transistor T1 is coupled to the pre-charging signal input terminal INPUT to receive a pre-charging signal, a first electrode of the first transistor T1 is coupled to the pre-charging signal input terminal INPUT, and a second electrode of the first transistor T1 is coupled to the pull-up node PU.

In some embodiments, the pull-down control circuit 5 may include a fourth transistor T4 and a fifth transistor T5. A control electrode of the fourth transistor T4 is coupled to the pull-up node PU, a first electrode of the fourth transistor T4 is coupled to the first power terminal to receive the first power voltage VGL1, and a second electrode of the fourth transistor T4 is coupled to the pull-down node PD. A control electrode of the fifth transistor T5 is coupled to the reset signal input terminal RESET to receive the reset signal, a first electrode of the fifth transistor T5 is coupled to the pull-down node PD, and a second electrode of the fifth transistor T5 is coupled to the second power terminal to receive the second power voltage VGH2.

In some embodiments, the reset circuit 2 may include a sixth transistor T6. A control electrode of the sixth transistor T6 is coupled to the pull-down node PD, a first electrode of the sixth transistor T6 is coupled to the pull-up node PU, and a second electrode of the sixth transistor T6 is coupled to the first power terminal to receive the first power voltage VGL1.

In some embodiments, the pull-up circuit 3 may include a seventh transistor T7 and a capacitor C. A control electrode of the seventh transistor T7 is coupled to the pull-up node PU, a first electrode of the seventh transistor T7 is coupled to the second clock signal input terminal CK2 to receive the second clock signal, a second electrode of the seventh transistor T7 is coupled to the signal output terminal OUTPUT, a first end of the capacitor C is coupled to the pull-up node PU, and a second end of the capacitor C is coupled to the signal output terminal OUTPUT.

In some embodiments, the pull-down circuit 4 may include an eighth transistor T8. A control electrode of the eighth transistor T8 is coupled to the pull-down node PD, a first electrode of the eighth transistor T8 is coupled to the signal output terminal OUTPUT, and a second electrode of the eighth transistor T8 is coupled to the third power terminal to receive the third power voltage VGL3.

An operation process of the shift register shown in FIG. 3 will be described in detail below with reference to the accompanying drawings. The first power terminal and the third power terminal supply low-level voltages VGL1 and VGL3, respectively, and the second power terminal supplies a high-level voltage VGH2.

Figure 4:
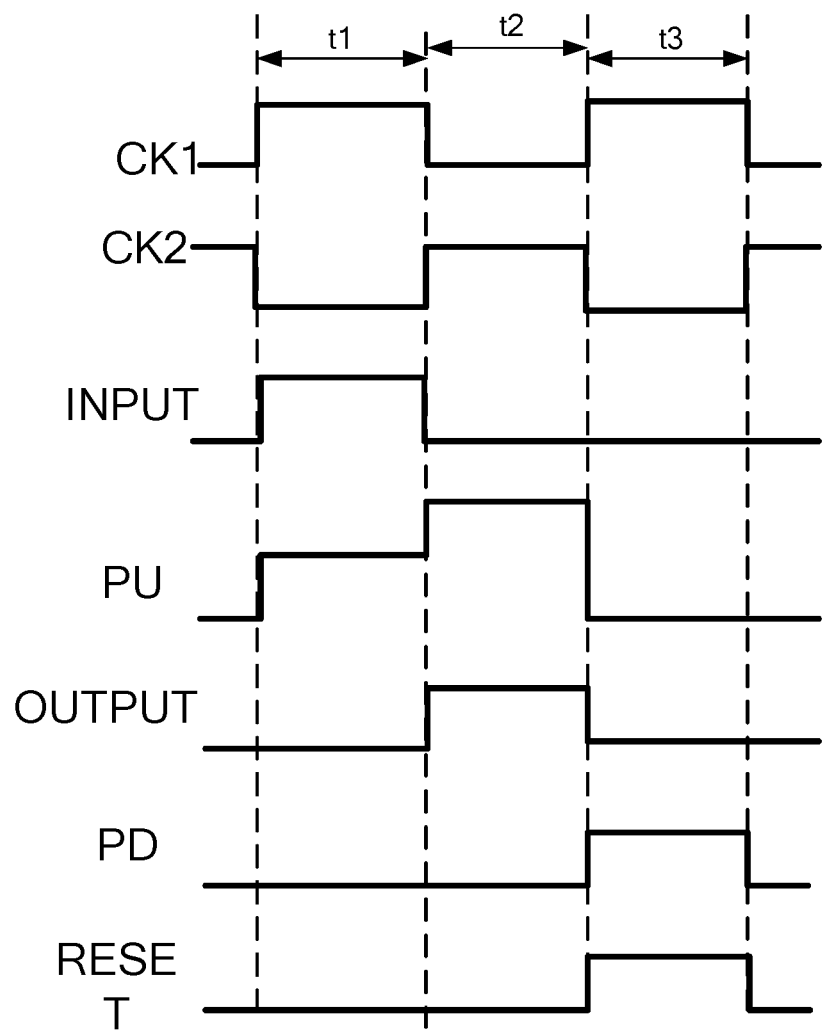
FIG. 4 is a chart showing an operation sequence of the shift register shown in FIG. 3.

FIG. 4 is a chart showing an operation sequence of the shift register shown in FIG. 3. As shown in FIG. 4, the operation process of the shift register includes three phases: a pre-charging phase t1, an output phase t2, and a reset phase t3.

During the pre-charging phase t1, the second clock signal supplied from the second clock signal input terminal CK2 is at a low-level, and the pre-charging signal supplied from the pre-charging signal input terminal INPUT is at a high-level, and the reset signal supplied from the reset signal input terminal RESET is at a low-level.

Since the pre-charging signal is at a high-level, the first transistor T1 is turned on, and the pre-charging signal at a high-level charges the pull-up node PU through the first transistor T1, so that the pull-up node PU is at a high-level, at this time, the seventh transistor T7 is turned on, and the second clock signal at the low-level is written to the signal output terminal OUTPUT through the seventh transistor T7, that is, the signal output terminal OUTPUT outputs a low-level signal.

At the same time, since the pull-up node PU is at the high-level, the fourth transistor T4 is turned on, and the first power supply voltage VGL1 being at the low-level is written to the pull-down node PD through the fourth transistor T4, so that the pull-down node PD is at a low-level, at this time, the sixth transistor T6 and the eighth transistor T8 are both in an off state in response to the low-level of the pull-down node PD. Therefore, the sixth transistor T6 does not output a leakage current, that is, does not affect the pre-charging process of the pull-up node PU.

During the output phase t2, the second clock signal supplied from the second clock signal input terminal CK2 is at a high-level, the pre-charging signal supplied from the pre-charging signal input terminal INPUT is at a low-level, and the reset signal supplied from the reset signal input terminal RESET is at a low-level.

Since the pre-charge signal is at the low-level, the first transistor T1 is turned off, and the pull-up node PU is in a floating state, that is, the first end of the capacitor C is in a floating state, and the seventh transistor T7 maintains on-state, the second clock signal at the high-level is written to the signal output terminal OUTPUT through the seventh transistor T7, that is, the signal output terminal OUTPUT outputs a high-level signal. During this process, since a voltage at the second end of the capacitor C jumps, under the boot strap of the capacitor C, the voltage at the first end of the capacitor C is pulled up to a higher potential, that is, the potential of the pull-up node PU is pulled up to a higher potential.

At the same time, since the pull-up node PU is in the floating state, the fourth transistor T4 maintains on-state in response to the floating state of the pull-up node PU, so that the pull-down node PD maintains the low-level. The fifth transistor T5, the sixth transistor T6, and the eighth transistor T8 maintain off-state.

During the reset phase t3, the second clock signal supplied from the second clock signal input terminal CK2 is at a low-level, the pre-charging signal supplied from the pre-charging signal input terminal INPUT is at a low-level, and the reset signal supplied from the reset signal input terminal RESET is at a high-level.

Since the reset signal is at the high-level, the fifth transistor T5 is turned on, and the second power voltage VGH2 at the high-level is written to the pull-down node PD through the fifth transistor T5, so that the pull-down node PD is at a high-level, the sixth transistor T6 and the eighth transistor T8 are both turned on in response to the high-level potential of the pull-down node PD.

Since the sixth transistor T6 is turned on, the first power voltage VGL1 at the low-level is written to the pull-up node PU through the sixth transistor T6, and the pull-up node PU is reset to the low-level, and the fourth transistor T4 and the seven transistors T7 are all turned off.

Since the eighth transistor T8 is turned on, the third power voltage VGL3 at the low level is written to the signal output terminal OUTPUT through the eighth transistor T8, that is, the signal output terminal OUTPUT outputs a low-level signal.

In the technical solutions of embodiments of the present disclosure, the pull-down control circuit is provided and the reset circuit is controlled to operate by using the pull-down node. During the pre-charging phase, the fourth transistor in the pull-down control circuit is turned on, and the low-level voltage is written to the pull-down node through the four transistor, so that the pull-down node is at a low-level, thereby ensuring that the sixth transistor in the reset circuit is always in the off-state, and the sixth transistor cannot output a leakage current, thereby affecting on the pre-charging process of the pull-up node can be avoided.

FIG. 5 is a schematic diagram of a circuit structure of a shift register according to an embodiment of the present disclosure. As shown in FIG. 5, the shift register shown in FIG. 5 may further include a voltage stabilizing circuit 6, the voltage stabilizing circuit 6 is coupled to the first electrode of the transistor T1 and the second clock signal input terminal, respectively, and is configured to provide a high-level potential to the first electrode of the first transistor in response to a second clock signal having a high-level potential supplied from the second clock signal input terminal. For example, during the output phase, the second electrode of the first transistor T1 is coupled to the pull-up node PU, so that it has a higher potential which is the same as that of the pull-up node PU, and the voltage stabilizing circuit 6 supplies, in response to the second clock signal having the high-level potential from the second clock signal input terminal, the second clock signal at the high-level to the first electrode of the first transistor T1 (i.e., the node A), such that a voltage difference between the first electrode and the second electrode of the first transistor T1 is reduced, therefore, leakage current can be prevented from being generated at the first transistor T1, thereby maintaining the stability of the voltage of the pull-up node PU.

In some embodiments, the voltage stabilizing circuit 6 may include a second transistor T2 and a third transistor T3. The first electrode of the first transistor T1 is coupled to the pre-charging signal input terminal INPUT through the second transistor T2. A control electrode of the second transistor T2 is coupled to the first clock signal input terminal CK1, a first electrode of the second transistor T2 is coupled to the pre-charging signal input terminal INPUT, and a second electrode of the second transistor T2 is coupled to the first electrode of the first transistor T1. A control electrode of the third transistor T3 is coupled to the second clock signal input terminal CK2, a first electrode of the third transistor T3 is coupled to the first electrode of the first transistor T1, and a second electrode of the third transistor T3 is coupled to the second clock signal input terminal CK2. A phase of the second clock signal supplied from the second clock signal input terminal CK2 is opposite to a phase of the first clock signal supplied from the first clock signal input terminal CK1, as shown in FIG. 4.

For the operation sequence of the shift register shown in FIG. 5, reference may be made to FIG. 4, and the specific operation process may refer to the content in the foregoing embodiment, and details are not described herein again. Only the operation process of the voltage stabilizing circuit 6 will be described here.

During the pre-charging phase, since the first clock signal is at a high-level, the second transistor T2 is turned on, and the pre-charging signal can be written to the pull-up node PU through the second transistor T2 and the first transistor T1. At the same time, since the second clock signal is at a low-level, the third transistor T3 is in an off-state.

During the output phase, since the first clock signal is at a low-level, the second transistor T2 is turned off. At the same time, since the second clock signal is at the high-level, the third transistor T3 is turned on, and the second clock signal at the high-level is written to the first electrode of the first transistor T1 through the third transistor T3. Therefore, the voltage difference between the first electrode and the second electrode of the first transistor T1 can be reduced.

During the reset phase, since the first clock signal is at a high-level, the second transistor T2 is turned on; and since the pre-charging signal is at a low-level, the first transistor T1 is turned off, and the pre-charging signal is not written to the pull-up node PU at this time.

In this embodiment, the voltage stabilizing circuit is provided, and the voltage stabilizing circuit can provide a high-level signal to the first electrode of the first transistor during the output phase to reduce the voltage difference between the first electrode and the second electrode of the first transistor, avoiding leakage current being generated at the first transistor, which is beneficial to maintain the stability of the voltage of the pull-up node.

At least one embodiment of the present disclosure provides a shift register, in which the pull-down control circuit is provided, and the pull-down control circuit is used to control the pull-down node to be at a low-level during the pre-charging phase, so that the reset circuit does not operate, and does not output a leakage current, preventing the reset circuit from affecting the pre-charging process of the pull-up node.

FIG. 6 is a flowchart of a driving method of a shift register according to an embodiment of the present disclosure, as shown in FIG. 6, the shift register is one provided in any one of the above embodiments, and the driving method of the shift register may include steps S101 to S103.

At step S101, during a pre-charging phase, the pre-charging circuit pre-charges the potential of the pull-up node in response to the pre-charging signal supplied from the pre-charging signal input terminal, and the pull-down control circuit pulls down the potential of the pull-down node to the second potential in response to the potential of the pull-up node.

At step S102, during an output stage, the pull-up circuit pulls up the potential of the signal output terminal in response to the potential of the pull-up node.

It should be noted that in a case where the voltage stabilizing circuit is included in the shift register, the output phase may further include: the voltage stabilizing circuit supplies a high-level signal to the first electrode of the first transistor to avoid leakage current being generated at the first transistor.

At step S103, during a reset phase, the pull-down control circuit pulls up the potential of the pull-down node to the first potential in response to the reset signal supplied from the reset signal input terminal, the reset circuit resets the potential of the pull-up node in response to the first potential of the pull-down node, and the pull-down circuit pulls down the potential of the signal output terminal in response to the first potential of the pull-down node.

Further, during the pre-charging phase, the pull-down control circuit supplies a voltage at a low level to the pull-down node in response to the potential of the pull-up node to pull down the potential of the pull-down node to the second potential (e.g., the second potential may be a low-level potential).

During the reset phase, the pull-down control circuit supplies a voltage at a high level to the pull-down node in response to the reset signal to pull up the potential of the pull-down node to the first potential (e.g., the first potential may be a high-level potential), and the reset circuit supplies a voltage at a low-level to the pull-up node to reset the pull-up node in response to the first potential of the pull-down node, and the pull-down circuit supplies a voltage at a low-level to the signal output terminal in response to the first potential of the pull-down node to pull down the potential of the signal output terminal.

For the detailed description of the foregoing steps S101 to S103, the content in any one of the foregoing embodiments may be referred to, and details thereof are not described herein again.

Some embodiments of the present disclosure provide a driving method of a shift register, in which the pull-down control circuit is provided, and the pull-down control circuit is used to control the pull-down node to be at a low-level during the pre-charging phase, so that the reset circuit does not operate, and does not output a leakage current, preventing the reset circuit from affecting the pre-charging process of the pull-up node.

Figure 7:
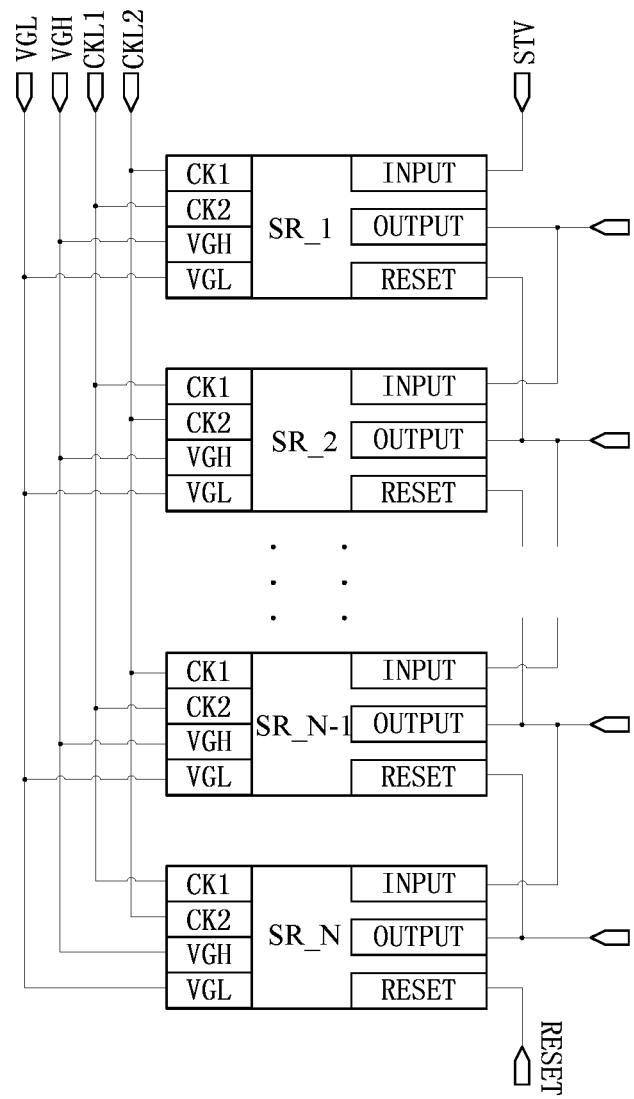
FIG. 7 is a schematic diagram of a circuit structure of a gate driving circuit according to an embodiment of the present disclosure.

FIG. 7 is a schematic diagram of a circuit structure of a gate driving circuit according to some embodiments of the present disclosure. As shown in FIG. 7, the gate driving circuit may include a plurality of shift registers SR_1/SR_2 . . . /SR_N−1/SR_N cascaded. The shift registers SR_1 . . . SR_N may each adopt the shift register provided in any one of the above embodiments.

In the gate driving circuit, except the shift register SR_1 of the first stage, the pre-charging signal input terminal INPUT of the shift register of each stage is coupled to the signal output terminal of the shift register of a previous stage. Except the shift register SR_N of the last stage, the reset signal input terminal RESET of the shift register of each stage is coupled to the signal output terminal of the shift register of a next stage.

In a practical application, the first clock signal input terminal CK1 of the shift register of the odd-numbered stage is coupled to a first clock signal line CKL1, and the second clock signal input terminal CK2 of the shift register of the odd-numbered stage is coupled to a second clock signal line CKL2; the first clock signal input terminal CK1 of the shift register of the even-numbered stage is coupled to the second clock signal line CKL2, and the second clock signal input terminal CK2 of the shift register of the even-numbered stage is coupled to the first clock signal line CKL1. Phases of the clock signals in the first clock signal line CKL1 and the second clock signal line CKL2 are opposite to each other.

Some embodiments of the present disclosure provide a display device, which may include a gate driving circuit, wherein the gate driving circuit may employ the gate driving circuit provided in the above embodiments.

It should be understood that, the foregoing embodiments are only exemplary embodiments used for explaining the principle of the present disclosure, but the present disclosure is not limited thereto. Various variations and modifications may be made by a person skilled in the art without departing from the spirit and essence of the present disclosure, and these variations and modifications also fall into the protection scope of the present disclosure.

What is claimed is:
1. A shift register, comprising:
a pre-charging circuit respectively coupled to a pre-charging signal input terminal and a pull-up node, and configured to pre-charge a potential of the pull-up node in response to a pre-charging signal supplied from the pre-charging signal input terminal;
a pull-down control circuit respectively coupled to the pull-up node, a pull-down node and a reset signal input terminal, and configured to pull down a potential of the pull-down node to a second potential in response to the potential of the pull-up node, and pull up the potential of the pull-down node to a first potential in response to a reset signal supplied from the reset signal input terminal;
a pull-up circuit respectively coupled to the pull-up node and a signal output terminal, and configured to pull up a potential of the signal output terminal in response to the potential of the pull-up node for outputting;
a pull-down circuit respectively coupled to the pull-down node and the signal output terminal, and configured to pull down the potential of the signal output terminal in response to the first potential of the pull-down node; and
a reset circuit respectively coupled to the pull-up node and the pull-down node, and configured to be turned off in response to the second potential of the pull-down node, and reset the potential of the pull-up node in response to the first potential of the pull-down node,
wherein the pre-charging circuit comprises a first transistor, a control electrode of the first transistor is coupled to the pre-charging signal input terminal, a first electrode of the first transistor is coupled to the pre-charging signal input terminal, and a second electrode of the first transistor is coupled to the pulled-up node; and
the shift register further comprises a voltage stabilizing circuit coupled to the first electrode of the first transistor and a second clock signal input terminal, and configured to supply a high-level potential to the first electrode of the first transistor in response to a high-level potential supplied from the second clock signal input terminal, wherein
the voltage stabilizing circuit comprises a second transistor and a third transistor, the first electrode of the first transistor is coupled to the pre-charging signal input terminal through the second transistor;
a control electrode of the second transistor is coupled to the first clock signal input terminal, a first electrode of the second transistor is coupled to the pre-charging signal input terminal, and a second electrode of the second transistor is coupled to the first electrode of the first transistor;
a control electrode of the third transistor is coupled to the second clock signal input terminal, a first electrode of the third transistor is coupled to the first electrode of the first transistor, and a second electrode of the third transistor is coupled to the second clock signal input terminal;

the second clock signal supplied from the second clock signal input terminal has a phase opposite to a phase of the first clock signal supplied from the first clock signal input terminal.

2. The shift register of claim 1, wherein the pull-down control circuit comprises a fourth transistor and a fifth transistor,
- a control electrode of the fourth transistor is coupled to the pull-up node, a first electrode of the fourth transistor is coupled to a first power terminal, and a second electrode of the fourth transistor is coupled to the pull-down node;
- a control electrode of the fifth transistor is coupled to the reset signal input terminal, a first electrode of the fifth transistor is coupled to the pull-down node, and a second electrode of the fifth transistor is coupled to a second power terminal.

3. The shift register of claim 2, wherein the reset circuit comprises a sixth transistor, a control electrode of the sixth transistor is coupled to the pull-down node, a first electrode of the sixth transistor is coupled to the pull-up node, and a second electrode of the sixth transistor is coupled to the first power terminal.

4. The shift register of claim 1, wherein the pull-up circuit comprises a seventh transistor and a capacitor, a control electrode of the seventh transistor is coupled to the pull-up node, a first electrode of the seventh transistor is coupled to the second clock signal input terminal, and a second electrode of the seventh transistor is coupled to the signal output terminal, and
- a first end of the capacitor is coupled to the pull-up node, and a second end of the capacitor is coupled to the signal output terminal.

5. The shift register of claim 1, wherein the pull-down circuit comprises an eighth transistor, a control electrode of the eighth transistor is coupled to the pull-down node, a first electrode of the eighth transistor is coupled to the signal output terminal, and a second electrode of the eighth transistor is coupled to a third power terminal.

6. The shift register of claim 1, wherein
- the reset circuit is coupled to the first power terminal, and configured to supply, in response to the first potential of the pull-down node, a first power voltage supplied from the first power terminal to the pull-up node to reset the pull-up node;
- the pull-down control circuit is coupled to the second power terminal and configured to supply, in response to the reset signal, a second power voltage supplied from the second power terminal to the pull-down node to pull up the potential of the pull-down node to the first potential;
- the pull-down circuit is coupled to the third power terminal and configured to supply, in response to the potential of the pull-down node, a third power voltage supplied from the third power terminal to the signal output terminal to pull down the potential of the signal output terminal; and
- the pull-up circuit is coupled to the second clock signal input terminal and configured to pull up, in response to the potential of the pull-up node, the potential of the signal output terminal by using the second clock signal input from the second clock signal input terminal for outputting.

7. The shift register of claim 6, wherein both the first power voltage and the third power voltage are voltages at a low-level, and the second power voltage is a voltage at a high-level.

8. A gate driving circuit, comprising a plurality of shift registers according to claim 1 coupled in cascaded;
- except the shift register of the first stage, the pre-charging signal input terminal of the shift register of each stage is coupled to the signal output terminal of the shift register of a previous stage;
- except the shift register of the last stage, the reset signal input terminal of the shift register of each stage is coupled to the signal output terminal of the shift register of a next stage.

9. A display device, comprising the gate driving circuit of claim 8.

10. A driving method of the shift register of claim 1, comprising:
- during a pre-charging phase, the pre-charging circuit pre-charges the potential of the pull-up node in response to the pre-charging signal supplied from the pre-charging signal input terminal, and the pull-down control circuit pulls down the potential of the pull-down node to the second potential in response to the potential of the pull-up node;
- during an output phase, the pull-up circuit pulls up the potential of the signal output terminal in response to the potential of the pull-up node;
- during a reset phase, the pull-down control circuit pulls up the potential of the pull-down node to the first potential in response to the reset signal supplied from the reset signal input terminal, the reset circuit resets the potential of the pull-up node in response to the first potential of the pull-down node, and the pull-down circuit pulls down the potential of the signal output terminal in response to the first potential of the pull-down node;
- a voltage stabilizing circuit supplies a potential at a high-level to the first electrode of the first transistor; and wherein
- during the pre-charging phase, the pull-down control circuit supplies a voltage at a low-level to the pull-down node in response to the potential of the pull-up node to pull down the potential of the pull-down node to the second potential;
- during the reset phase, the pull-down control circuit supplies a voltage at a high-level to the pull-down node in response to the reset signal to pull up the potential of the pull-down node to the first potential, and the reset circuit supplies a voltage at a low-level to the pull-up node to reset the pull-up node in response to the first potential of the pull-down node, and the pull-down circuit supplies, in response to the first potential of the pull-down node, a voltage at a low-level to the signal output terminal to pull down the potential of the signal output terminal.

11. The shift register of claim 1, wherein the pull-down control circuit comprises a fourth transistor and a fifth transistor,
- a control electrode of the fourth transistor is coupled to the pull-up node, a first electrode of the fourth transistor is coupled to a first power terminal, and a second electrode of the fourth transistor is coupled to the pull-down node;
- a control electrode of the fifth transistor is coupled to the reset signal input terminal, a first electrode of the fifth transistor is coupled to the pull-down node, and a second electrode of the fifth transistor is coupled to a second power terminal.

12. The shift register of claim 11, wherein the reset circuit comprises a sixth transistor, a control electrode of the sixth transistor is coupled to the pull-down node, a first electrode of the sixth transistor is coupled to the pull-up node, and a second electrode of the sixth transistor is coupled to the first power terminal.

13. The shift register of claim 3, wherein the pull-up circuit comprises a seventh transistor and a capacitor, a control electrode of the seventh transistor is coupled to the pull-up node, a first electrode of the seventh transistor is coupled to the second clock signal input terminal, and a second electrode of the seventh transistor is coupled to the signal output terminal, and a first end of the capacitor is coupled to the pull-up node, and a second end of the capacitor is coupled to the signal output terminal.

14. The shift register of claim 12, wherein the pull-up circuit comprises a seventh transistor and a capacitor, a control electrode of the seventh transistor is coupled to the pull-up node, a first electrode of the seventh transistor is coupled to the second clock signal input terminal, and a second electrode of the seventh transistor is coupled to the signal output terminal, and a first end of the capacitor is coupled to the pull-up node, and a second end of the capacitor is coupled to the signal output terminal.

15. The shift register of claim 14, wherein the pull-down circuit comprises an eighth transistor, a control electrode of the eighth transistor is coupled to the pull-down node, a first electrode of the eighth transistor is coupled to the signal output terminal, and a second electrode of the eighth transistor is coupled to a third power terminal.

\* \* \* \* \*